United States Patent [19]
Hoffmann et al.

[11] 4,121,117
[45] Oct. 17, 1978

[54] REGENERATOR CIRCUIT FOR CCD ARRANGEMENTS

[75] Inventors: Kurt Hoffmann, Taufkirchen; Gottfried Wotruba, Munich, both of Germany

[73] Assignee: Siemens Aktiengesellschaft, Berlin & Munich, Germany

[21] Appl. No.: 720,050

[22] Filed: Sep. 2, 1976

[30] Foreign Application Priority Data
Sep. 18, 1975 [DE] Fed. Rep. of Germany ....... 2541662

[51] Int. Cl.$^2$ ............... H01L 27/10; H01L 29/78; G11C 19/28
[52] U.S. Cl. ............... 307/221 D; 307/304; 307/DIG. 1; 307/DIG. 3; 307/DIG. 4; 357/24
[58] Field of Search ............ 307/221 D, 264, 304, 307/DIG. 1, DIG. 3, DIG.4; 357/24

[56] References Cited
U.S. PATENT DOCUMENTS

| | | | |
|---|---|---|---|
| 3,623,132 | 11/1971 | Green | 357/24 X |
| 3,758,794 | 9/1973 | Kosonocky | 307/DIG. 3 X |
| 3,775,693 | 11/1973 | Proebsting | 307/205 X |
| 3,814,955 | 6/1974 | Itoh et al. | 307/221 D X |
| 3,876,989 | 4/1975 | Bankowski et al. | 307/304 X |
| 3,911,464 | 10/1975 | Chang et al. | 357/24 X |
| 3,937,985 | 2/1976 | Cooper, Jr. | 307/304 X |
| 3,944,990 | 3/1976 | Chou | 357/24 X |
| 3,986,059 | 10/1976 | Mohsen | 307/304 |
| 3,988,617 | 10/1976 | Price | 307/DIG. 4 X |

OTHER PUBLICATIONS

Dennard, "Regeneration Circuit for Charge-Coupled Device Shift Registers"; *IBM Tech. Discl. Bull.*; vol. 14, No. 12, pp. 3791-3792; 5/1972.

Terman, "CCD Shift Register Read/Write/Regeneration Circuit"; *IBM Tech. Discl. Bull.*; vol. 14, No. 12, pp. 3784-3785; 5/1972.

Dennard et al., "Read/Write Amplifier for CCD Memory"; *IBM Tech. Discl. Bull.*; vol. 14, No. 12, pp. 3722-3723; 5/1972.

Ibrahim et al., "4096-BIT CCD Serial Memory Array"; 1973 *Int'l Electron Devices Conference; Technical Digest*; pp. 141-143; 12/3-5/1973.

*Primary Examiner*—Larry N. Anagnos
*Attorney, Agent, or Firm*—Hill, Gross, Simpson, Van Santen, Steadman, Chiara & Simpson

[57] ABSTRACT

Regenerating amplifier for use with two charge coupled devices comprising field effect transistors to pre-charge the output diffusion capacitance of an output charge coupled device and the input diffusion capacitance of an input charge coupled device. The output diffusion capacitance is discharged by the arrival of output charge, in turn holding off an input gate such that the charge on the input diffusion capacitance is not shifted into the input charge coupled device. Various embodiments having control potentials and a field effect transistor to fully discharge the input diffusion capacitance of an input charge coupled device being usable with a plurality of input charge coupled devices having corresponding output charge coupled devices wherein individual charging transistors are available to charge each output diffusion zone capacitance with a common transistor being used to charge all input diffusion capacitances.

23 Claims, 17 Drawing Figures

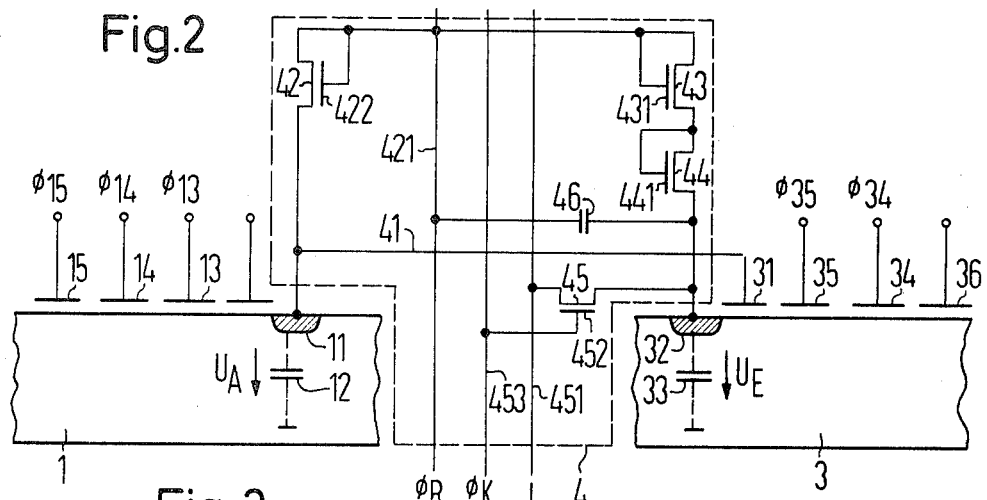
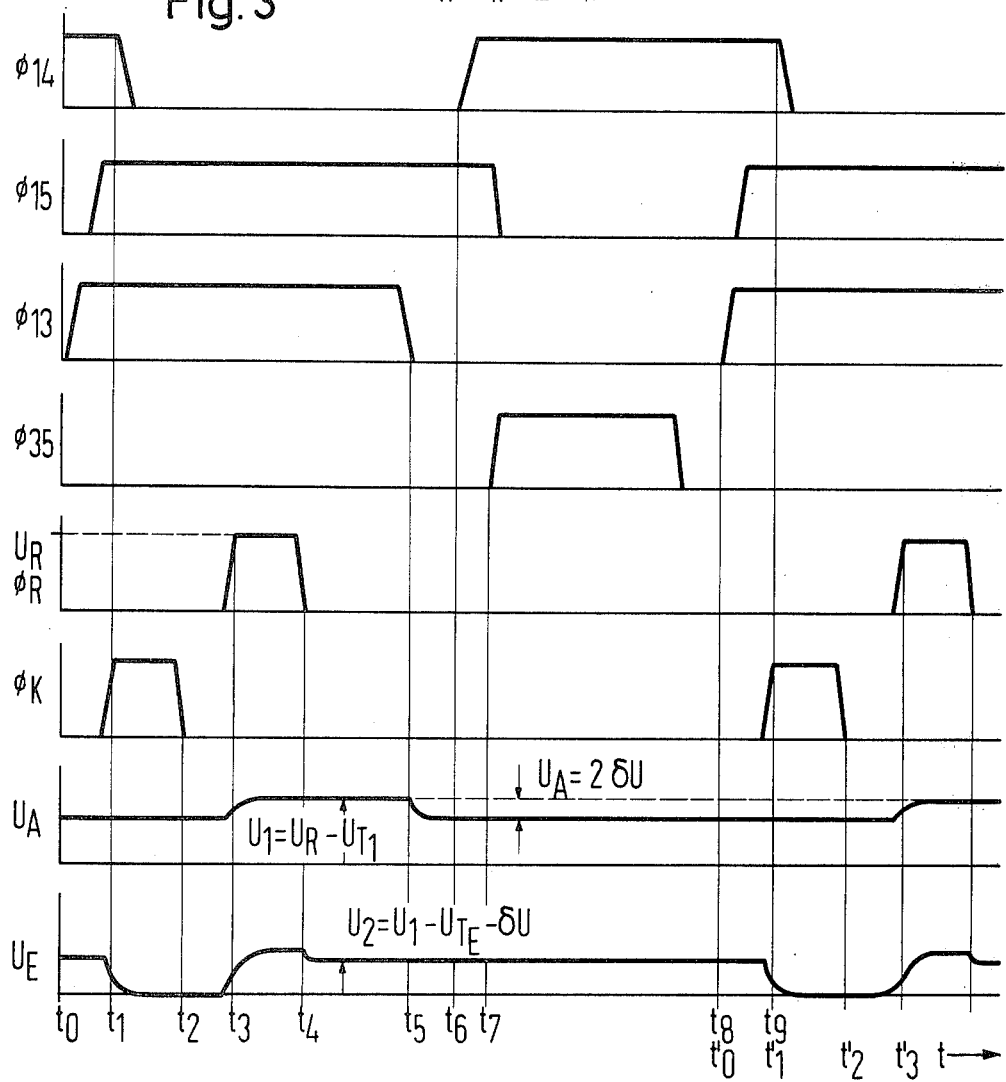

Fig.4
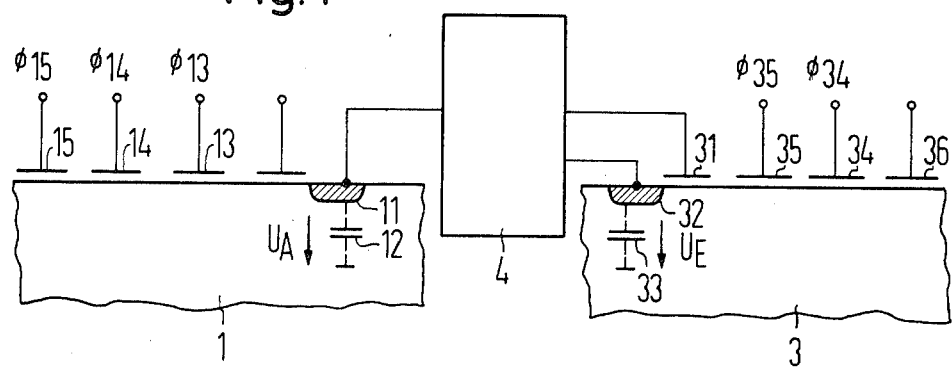
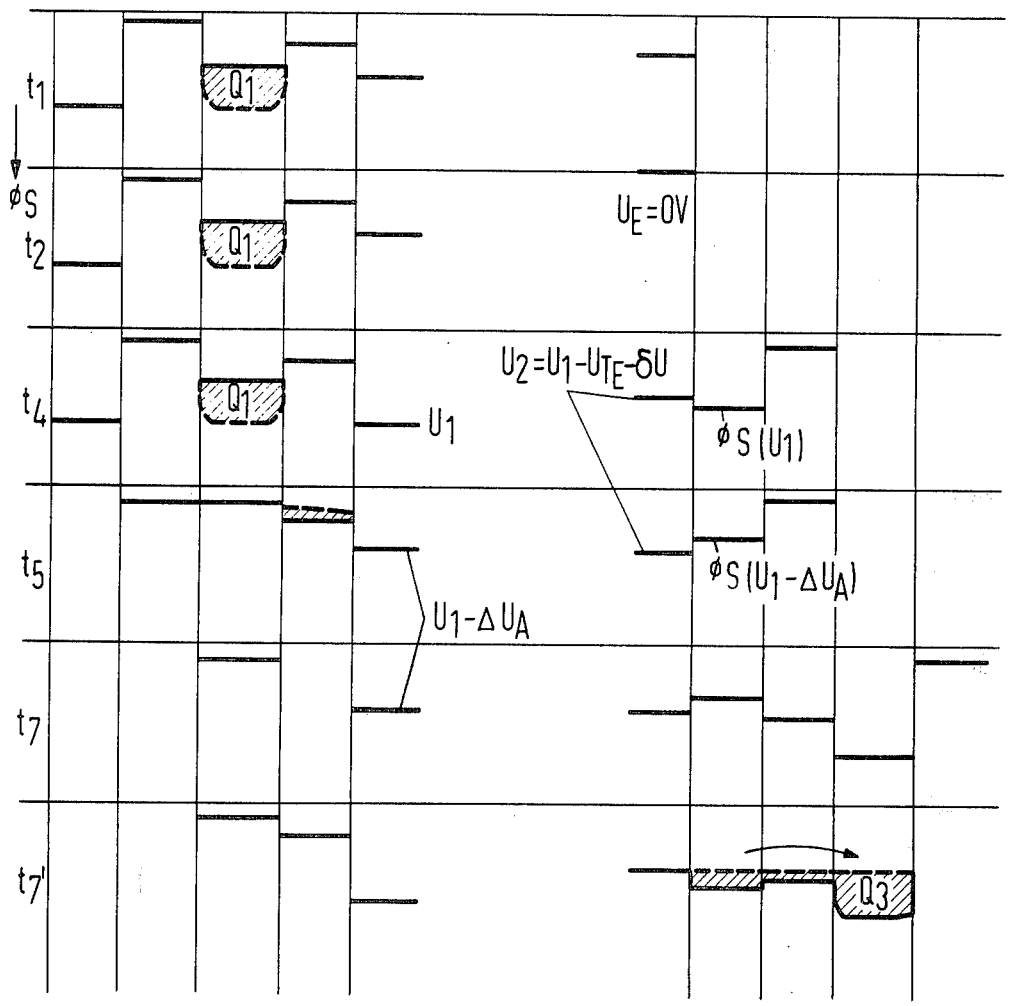

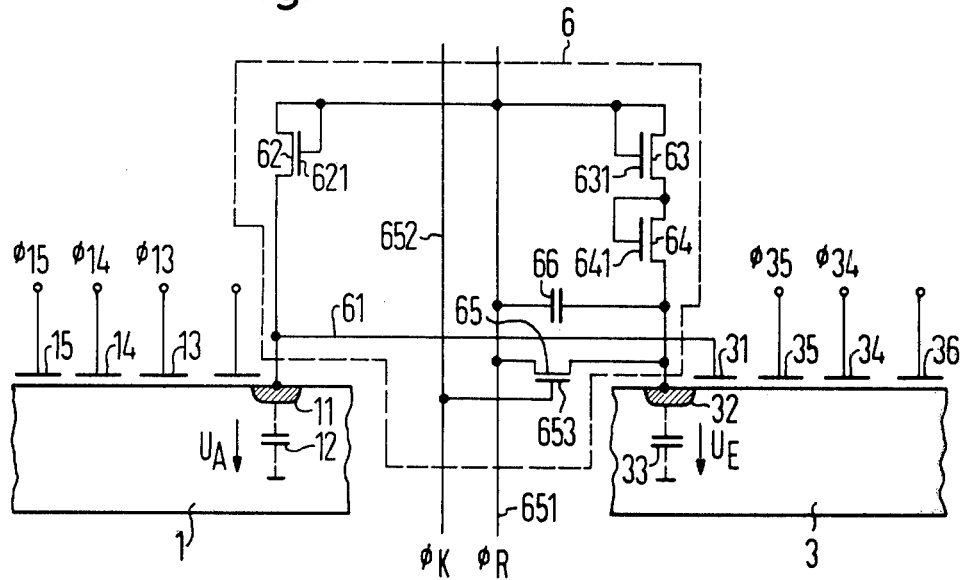
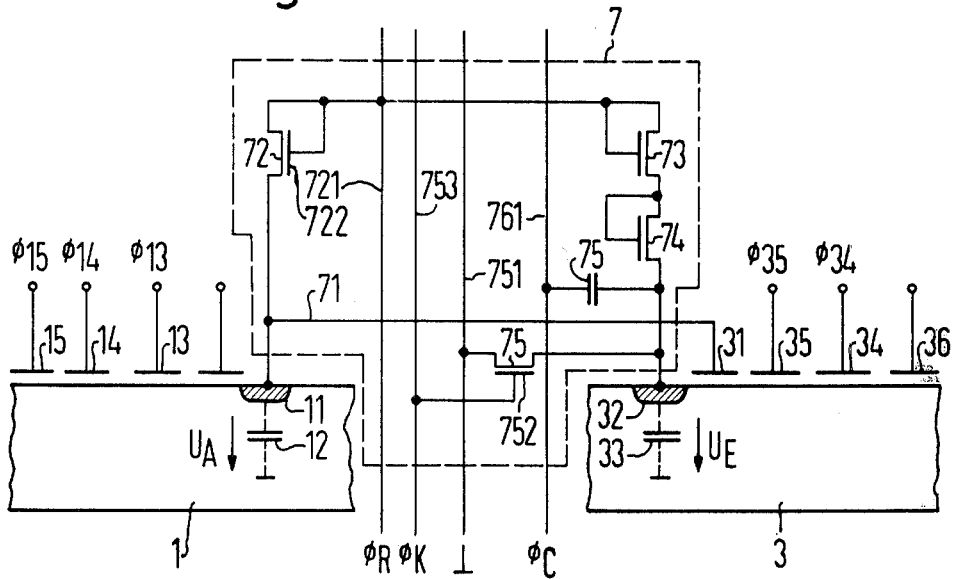

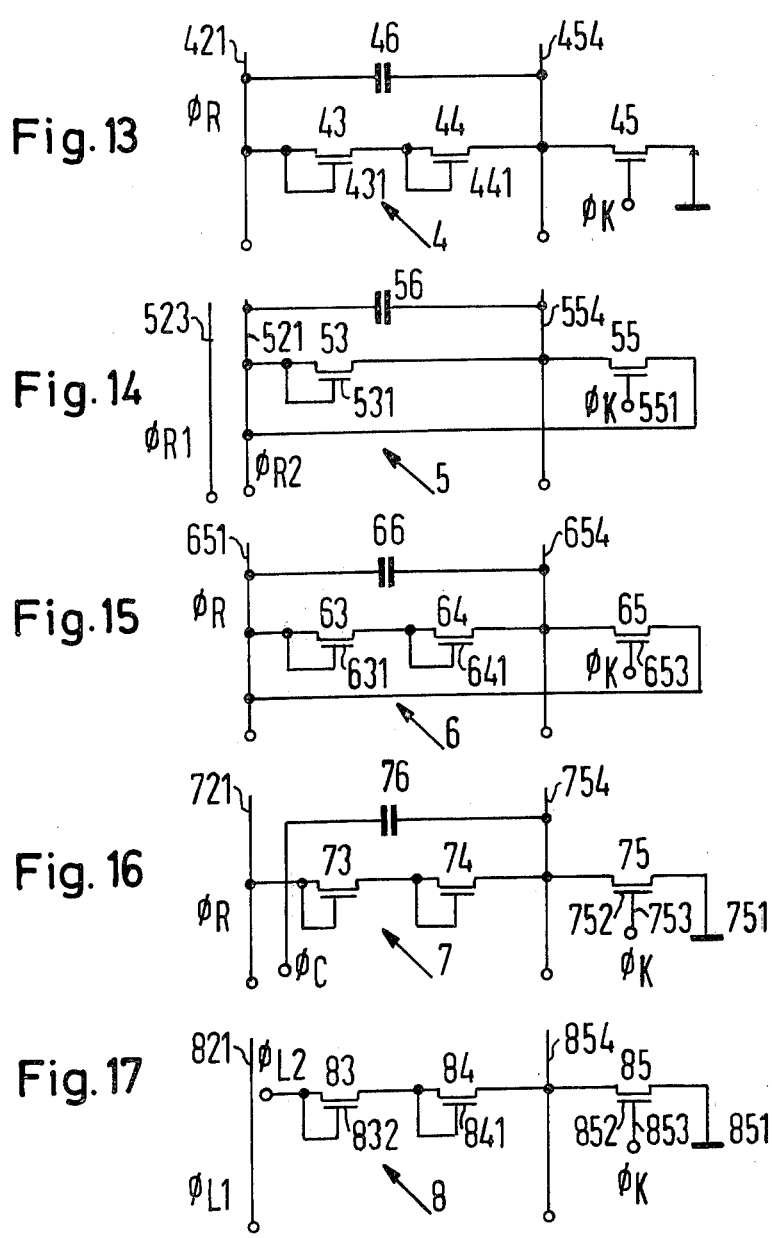

REGENERATOR CIRCUIT FOR CCD ARRANGEMENTS

BACKGROUND OF THE INVENTION

The invention relates to a regenerator circuit for CCD arrangements operating in accordance with the CCD principle (charge-coupled-device principle).

Several types of regenerator circuits for CCD arrangements are known. As described in the publication, W. F. Kosonocky, J. E. Carnes, "Charge Coupled Digital Circuits," IEEE Journal of Solid-State Circuits, Vol. SC-6, No. 5, October 1971, p. 314–322 in the one type of regenerator circuits, in addition to the charge representing the item of information, the so-called basic charge is also input. In digital application, for example, a charge $Q_1$ corresponds to the binary "1," and a charge $Q_0$ corresponds to the binary "0." In this operating mode long regeneration intervals can be achieved as a result of reduced transmission losses.

A disadvantage consists, however, in that a considerable circuitry amount is required for the determination of the two different quantities of charge $Q_0$ and $Q_1$ which are both unequal to 0, in the regenerator circuits. Therefore, only a comparatively coarse CCD draft raster can be achieved with this process.

Another type of known regenerator circuit is particularly suitable for digital operation. In this case, only with one of the two binary signals is charge input into the following CCD stage, so that, for example, the input charge $Q_1$ corresponds to a binary "1," and the charge $Q_0 = 0$ corresponds to a binary "0." Although with this principle the higher transmission losses means that only short regeneration intervals can be achieved, the smaller circuitry amount means, however, that a considerably higher packing density of the overall circuit can be achieved.

A disadvantage of these circuits consists, however, in the fact that the component straying on the semiconductor chip considerably affects the function.

SUMMARY OF THE INVENTION

The aim of the present invention consists, accordingly, in providing a regenerator circuit as described above, for short regeneration intervals, in which only the component straying of the components which are adjacent on the semiconductor chip in a regenerator circuit affects the function.

This aim is realized by a regenerator circuit for CCD arrangements comprising a first and second data storage device; a first capacitance and means to charge said first capacitance to a known potential; a second capacitance and means to charge said second capacitance to a known potential; means to detect the absence of charge at the output terminal of said first data storage device and upon detecting said absence of charge not discharge said first capacitance; gate means at the input to said second storage device detecting the presence of charge on said first capacitance and the injection of charge from said second capacitance into the input terminal of said second data storage device being blocked; means to detect the presence of charge at said output terminal of said first data storage device and upon detecting such presence said first capacitance being discharged upon said gate means detecting the absence of charge on said first capacitance and the injection of charge from said second capacitance into said second storage device being blocked.

An essential advantage of the invention consists in that the reference potentials which are essential to the function are in each case produced by the regenerator circuit itself.

In the following, the invention will be explained in detail, making reference to the description and the Figures.

BRIEF DESCRIPTION OF THE DRAWINGS

FIG. 2 schematically illustrates a regenerator circuit in accordance with the invention;

FIG. 3 shows the pulse train program for the circuit corresponding to FIG. 2;

FIG. 4 shows the circuit corresponding to FIG. 2 and the associated potential well model;

FIG. 7 illustrates a further development of the regenerator circuit in accordance with the invention with two pulse train supply lines;

FIG. 8 illustrates a further development of the regenerator circuit in accordance with the invention with four drive lines;

FIGS. 12 to 17 each show an interconnection of a plurality of regenerator circuits in accordance with the invention.

DESCRIPTION OF THE PREFERRED EMBODIMENTS

Figure 1:
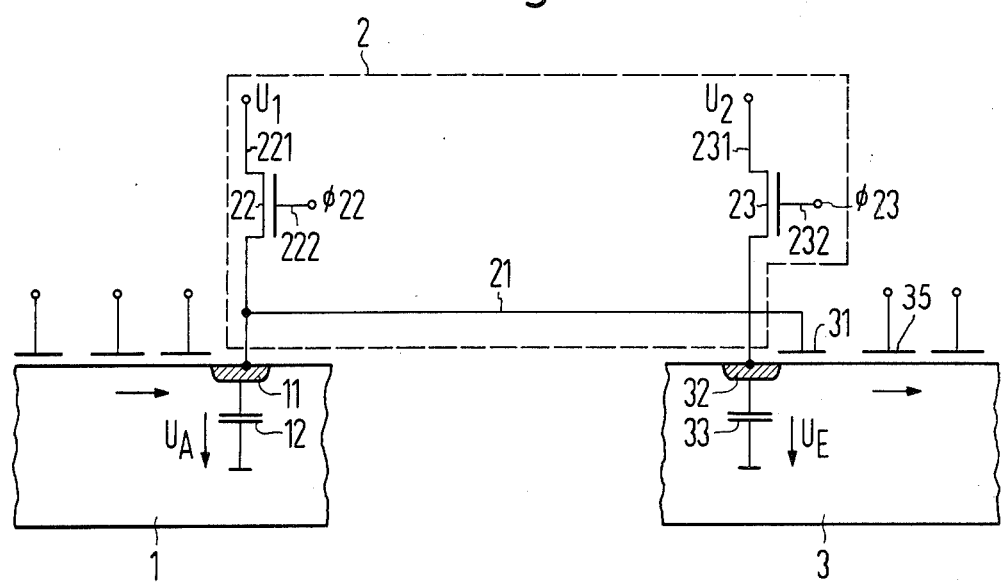
FIG. 1 schematically illustrates a known regenerator circuit, in which not only the charge representing the information, but also the so-called basic charge is input.

In FIG. 1, the CCD output stage is referenced 1, and the CCD input stage is referenced 3. The known regenerator amplifier 2 is arranged between the two stages. In this arrangement, the output diffusion zone 11 of the output stage 1 is connected via the line 21 to the gate electrode 31 of the input stage 3. The electrode 31 represents the gate electrode of the input transistor $T_E$ of the input stage 3. Here, this input transistor $T_E$ consists of the diffusion zone 32 acting as source and the gate electrode 31. The potential sink beneath the first CCD shift electrode 35 acts as drain of the transistor $T_E$, where the electrodes 31 and 35 possess the spacing which is characteristic of a CCD arrangement. 12 designates the overall capacitance of the output diffusion zone 11 of the output stage 1, of the line 21 and of the gate electrode 31. The capacitance of the diffusion zone 32 is referenced 33. Before the information transmission from the output CCD arrangement 1 to the input CCD arrangement 3, the capacitor 12 is pre-charged to a reference potential $U_A = U_1$ and the input diffusion zone 32 of the input stage 3 with the capacitance 33 is pre-charged to the reference potential $U_E = U_2$. For this purpose the transistor 22 is switched conductive via the potential $\phi$ 22 at its gate terminal 222, so that the potential $U_1$ present across its terminal 221 reaches the diffusion zone 11. In addition, the transistor 23 is switched conductive by the potential $\phi$ 23 which is present at its gate terminal 232, so that the potential $U_2$ present at its terminal 231 passes to the diffusion zone 32. Here the potentials $U_1$ and $U_2$ obey the equation:

$$U_1 - U_2 = U_A - U_E = U_{TE} + \delta U.$$

Here $U_{TE}$ is the start voltage of the input transistor $T_E$ of the input stage 3. $\delta U$ is advantageously contrived to be such that it is equal to half the signal amplitude $\Delta U_A/2$ which arises when a charge $Q_1$ is transmitted to the output diffusion zone 11, where $$\Delta U_A = Q_1/C_{12} = 2 \delta U \tag{1}$$

When the charge $Q_1$ arrives at the output diffusion zone 11, the input transistor $T_E$ of the input stage 3 is not switched conductive so that no charge $Q_3$ is input in the input CCD circuit 3. If a charge $Q_1$ fails to arrive in the output diffusion zone 11 of the output arrangement 1, the input transistor $T_E$ of the input stage 3 remains switched conductive on the other hand, so that the charge $Q_3$ is input in the CCD input stage 3. Thus, the circuit has an inverting operation.

The essential disadvantage of this circuit consists in that the potentials $U_1$ and $U_2$ for the plurality of regenerator circuits arranged on a semiconductor chip are only provided once. Due to the component straying on the semiconductor chip which, for example, contains a fluctuation in start voltage of $\Delta U_{TE}$ which can easily reach the magnitude of the voltage difference $\delta U$, the equation (1) is not fulfilled at the location of various regenerator circuits on the semiconductor chip, which as a rule means a breakdown of the overall circuit.

FIG. 2 illustrates a regenerator circuit in accordance with the invention. Here details of the Figure which have already been described in association with the known circuit shown in FIG. 1 bear the corresponding references. The regenerator circuit in accordance with the invention is referenced 4. In this circuit, the reference potentials $U_1$ and $U_2$ are produced in accordance with the equation (1) in each case directly at the location of the regenerator circuit 4. The advantage is thus achieved that only the component straying of the directly adjacent transistors in the regenerator circuit affects the function. In the circuit shown in FIG. 2, the reference voltages $U_1$ and $U_2$ are produced with the aid of the transistors 42 to 45. Here the transistor 45 is connected in the manner shown in the Figure on the one hand to the diffusion zone 32 of the input stage 3 and on the other hand to the line 451 which preferably is connected to ground. The gate terminal 452 of the transistor 45 is connected to the line 453, to which the potential $\phi_K$ can be connected. The transistor 42 is connected on the one hand to the diffusion zone 11 of the output stage 1 and on the other hand to a line 421. This line can be connected to the reference potential $\phi_R$. This line 421 is also connected to the gate terminal 422 of the transistor 42. This causes this transistor to act as load element. Similarly, the transistor 43 is connected on the one hand simultaneously by its gate terminal 431 to the line 421 and on the other hand to the transistor 44 which is likewise connected as load element. This transistor 44 is on the one hand, together with its gate terminal 441, connected to the transistor 43 and on the other hand is connected to the input diffusion zone 32 of the input stage 3. The output diffusion zone 11 is connected via the connection line 41 to the input diffusion zone 32.

Between the line 421 and the diffusion zone 32 is arranged the coupling capacitance 46, the dimensioning of which will be described in detail further in the description.

In the following, the function of the regenerator circuit corresponding to FIG. 2 will now be explained in association with the pulse train program corresponding to FIG. 3 and the potential well model corresponding to FIG. 4. Here in the potential well model shown in FIG. 4, for the individual times the potentials $\phi_S$ are given for the various locations of the input stage and output stage.

In the time interval between $t0$ and $t1$, charge is displaced from the electrode 14 to the electrode 13 as a result of the connection of the pulse train $\phi$ 13 which can be connected to the electrode 13 of the output stage, and by disconnecting the pulse train $\phi$ 14 which is connected to the electrode 14 of the output stage 1. At the time $t1$ the charge $\phi_1$ is localized in the potential well located beneath the electrode 14 (time $t1$ in FIG. 4).

At the times $t1$ and $t2$ the pulse train $\phi_K$ is switched on and subsequently switched off again. This causes the capacitor 33 to be connected to ground via the transistor 45 and thus to be discharged.

At the following times $t3$ and $t4$, the pulse train $\phi_R$ with the amplitude $U_R$ is switched on and off again. This means that at the time $t4$ a voltage $$U_A = U_1 = U_R - U_{T42} \tag{2}$$

drops across the capacitor 12, where $U_{T42}$ is the start voltage of the transistor 42. At the same time the voltage $$U_E = U_2 = U_R - U_{T43} - U_{T44} - \delta U \tag{3}$$

is produced across the capacitor 33, via the transistors 43 and 44, where $U_{T43}$ is the start voltage of the transistor 43, and $U_{T44}$ is the start voltage of the transistor 44. The voltage change $\delta U$ is capacitively input-coupled via the capacitor 46 at the time $t4$ on the disconnection of the pulse train $\phi_R$, and here the magnitude of the coupling capacitance of the capacitor 46 can be determined in accordance with the equation $$C_{46} = \frac{\delta U \cdot C_{33}}{U_R - \delta U} \quad \frac{\Delta U_{A/2} \cdot C_{33}}{U_R - \frac{\Delta U_A}{2}} \tag{4}$$

In this equation (4), $U_R$ signifies the amplitude of the pulse train $\phi_R$. The start voltages of the directly adjacent transistors 42, 43, 44 and $T_E$ in the circuit are equal in first approximation, so that from the equations (2) and (3) one obtains:

$$U_2 = U_R - U_{T43} - U_{T44} - \delta U = U_1 - U_{TE} - \delta U \tag{5}$$

Accordingly, the circuit operates independently of the magnitude of the amplitude $U_R$ and thus also independently of fluctuations in supply voltage.

At the time $t4$ the circuit is in the reference state and the input transistor $T_E$ of the input stage 3 is conductive. If, then, at the time $t5$, the pulse train $\phi$ 13 is switched off, the charge $Q_1$ passes to the output diffusion zone 11 and gives rise to a negative voltage change $|\Delta U_A|$, so that the input transistor $T_E$ of the input stage 3 blocks. The potential well formed beneath the electrode 34 as a result of the connection of the pulse train $\phi$ 34 at the time $t6$ remains empty, even when the pulse train $\phi$ 35 is connected to the electrode 35. If, on the other hand, no charge $Q_1$ reaches the output diffusion zone 11 at the time $t5$, the voltage $U_{12}$ across the capacitor 12 remains unchanged and the transistor $T_E$ of the input stage 3 remains conductive. This results in the fact that at the time $t7$, charge flows into the potential well located beneath the electrode 34. This is schematically illustrated in FIG. 4 for a time $t7'$.

At the following times $t8$ and $t9$, on the one hand the charge is transported on to the electrode 36, and on the other hand the next reference state is prepared, where in FIG. 3 the times $t0'$, $t1'$, $t2'$, etc. correspond to the times $t0$, $t1$, $t2$, etc.

Figure 5:
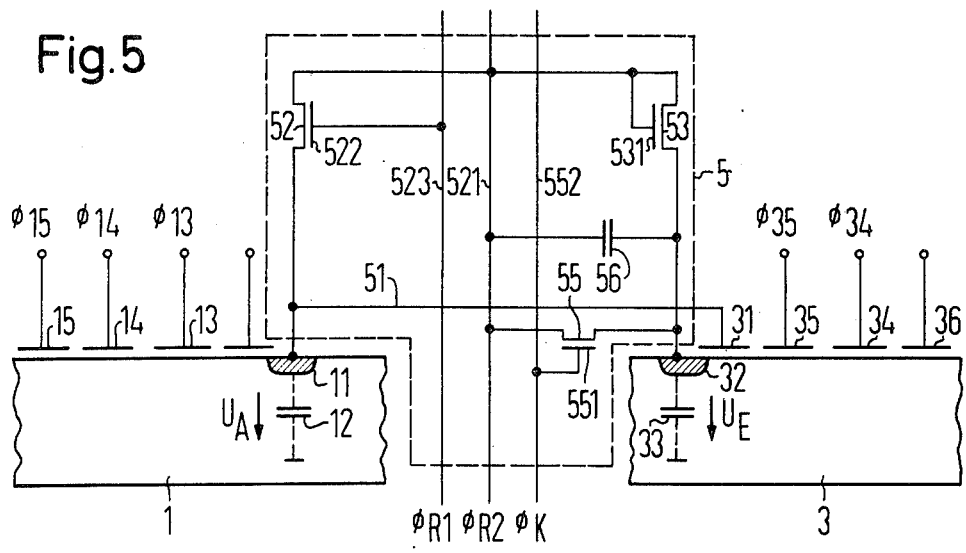
FIG. 5 illustrates a further development of the regenerator circuit in accordance with the invention.

In the further development of the regenerator circuit of the invention illustrated in FIG. 5, one transistor less is required than in the regenerator circuit of the invention shown in FIG. 2. Details of the circuit in FIG. 5 which have already been mentioned in association with the other Figures bear the corresponding references. In FIG. 5, the regenerator circuit is referenced 5 and in contrast to the regenerator circuit 4 offers the advantage of a smaller space requirement.

The transistor 52 is connected on the one hand to the output diffusion zone 11 and on the other hand to the line 521. The gate electrode 522 is operable via the line 523. The transistor 53 is on the one hand connected with its gate terminal 531 to the line 521 and on the other hand to the input diffusion zone 32. The transistor 55 is connected on the one hand to the input diffusion zone 32 and on the other hand to the line 521. The gate terminal 551 is operable via the line 552. The coupling capacitance 56 is arranged between the line 521 and the input diffusion zone 32. The diffusion zone 11 and the electrode 31 are connected to one another via the line 51.

Figure 6:
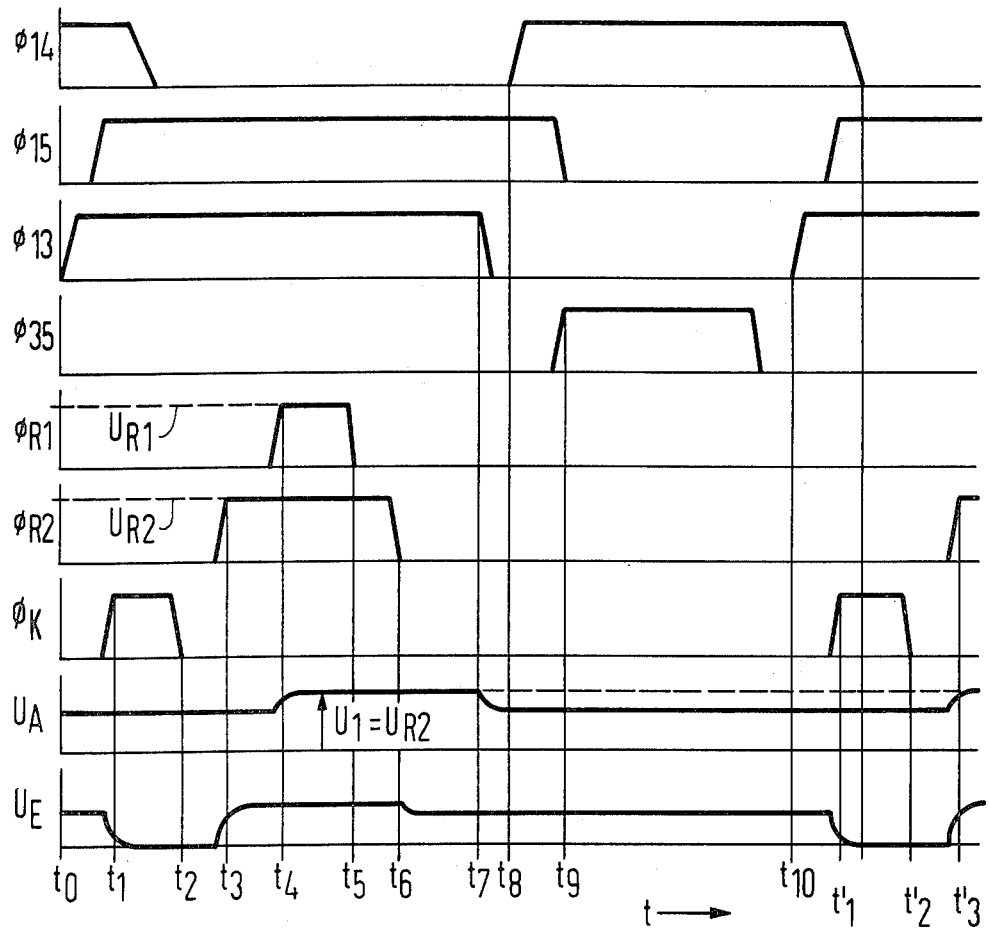
FIG. 6 shows the pulse train program relating to the circuit in FIG. 5.

In the following, the function of the regenerator circuit 5 in accordance with the invention will be explained making reference to FIGS. 5 and 6. The reference state is set up in that similarly to the circuit explained above in association with FIGS. 2, 3 and 4, first at the time $t1$, the capacitor 33 is discharged via the transistor 55. For this purpose, the latter is switched conductive by the pulse train $\phi_K$ connected to the line 552, and at the time 52 is switched nonconductive again.

In the time interval from $t3$ to $t6$, the reference potentials $U_1$ and $U_2$ are set up, where $U_1 = U_{R2}(5)$ and $U_2 = U_{R2} - U_{T53} - \delta U$ (6). In the equation (5) $U_{R2}$ is the amplitude of the pulse train $\phi_{R2}$ which is connected to the line 521. In operation it must be ensured that the amplitude $U_{R1}$ of the pulse train $\phi_{R1}$ connected to the line 523 fulfills the equation $U_{R1} \geq U_{R2} + U_{T52}(7)$, in order that the equation (5) is fulfilled.

FIG. 7 illustrates a further development 6 of the invention. Details of FIG. 7 which have already been described in association with the other Figures bear the corresponding references. In the case of the regenerator circuit 6 shown in FIG. 7, advantageously it is unnecessary to pay attention to the equation (7). Only the two drive lines 651 and 652 are provided. The transistors 62, 63 and 64 are arranged in the same way as the transistors 42, 43 and 44 already described in association with FIG. 2. The capacitor 66 is connected on the one hand to the line 651 and on the other hand to the diffusion zone 32. The transistor 65 is connected on the one hand to the line 651 and on the other hand to the diffusion zone 32. It is operable via the line 652 which is connected to its gate electrode 653. The diffusion zone 11 is connected via the line 61 to the electrode 31. The function of this circuit corresponds to the pulse train program represented in FIG. 3, the reference state being first set up in accordance with the equation (5).

FIG. 8 illustrates a further development 7 with four drive lines. Details of FIG. 8 which have already been described in association with the other Figures bear the corresponding references. The transistors 72, 73 and 74 again correspond to the arrangement of the transistors 42, 43 and 44 in FIG. 2. The capacitor 75 is connected on the one hand to the diffusion zone 32 and on the other hand to the drive line 761. The diffusion zone 11 is connected via the line 71 to the electrode 31. The transistor 75 is connected on the one hand to the diffusion zone 32 and on the other hand to the drive line 751, which is preferably connected to ground. Its gate 752 is operable via the line 753. The reference potential $\phi_R$ can be connected via a separate line 721. The function is again similar to the pulse train program already represented in FIG. 3, the reference state in each case being first set up in accordance with the equation (5).

The pulse train $\phi_C$ is connected via the line 761 to the capacitor 76, although this line does not lead to a further point of the circuit. It is thus possible to individually match the coupling voltage $\delta U$ (equations 1, 3, 4, 5, 6 and 7), which is of significance, for example, for experimental purposes.

With the aid of the circuit variants 4 and 5 (FIGS. 2 and 5), 6 (FIG. 7) and 7 (FIG. 8), it has been shown that the regenerator circuits in accordance with the invention can be optionally operated with three, two or also four discrete drive lines.

Figure 9:
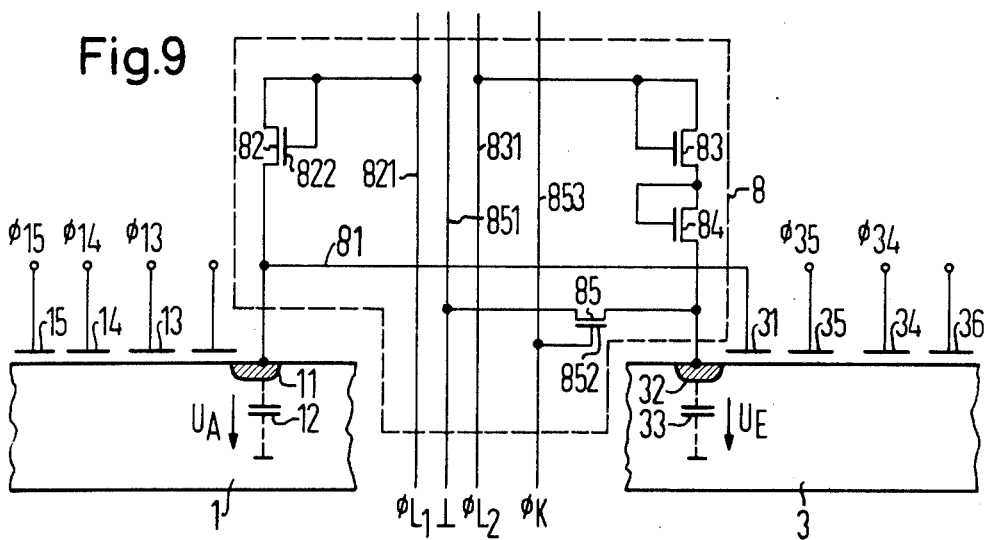
FIG. 9 illustrates another further development of the regenerator circuit in accordance with the invention.

FIG. 9 represents a further development 8 of the regenerator circuit in accordance with the invention. Details of FIG. 9 which have already been described in association with the other Figures, bear the corresponding references. The transistor 82 is operable via a separate line 821 which is also connected to the latter's gate terminal 822, with the pulse train $\phi_{L1}$. The transistors 83 and 84 are connected in the same manner as the transistors 43 and 44 in FIG. 2 and are operable via the line 831 by the pulse train $\phi_{L2}$. The transistor 85 is connected on the one hand to the diffusion zone 32 and on the other hand to a line 851 which is preferably connected to ground. The gate 852 of this transistor is controllable via the line 853 by the pulse train $\phi_K$. The amplitudes $U_{L1}$ and $U_{L2}$ of the pulse trains $\phi_{L1}$ and $\phi_{L2}$ are determined in accordance with the equation $$U_{L2} = U_{L1} - \delta U = U_{L1} - (\Delta U_A/2) \tag{8}$$

Instead of the capacitive input-coupling of the voltage $\delta U$, which is of decisive importance for the setting-up of the reference state, in this further development 8, the voltage $\delta U$ corresponding to equation (8) is set up by the difference between the amplitudes $U_{L1}$ and $U_{L2}$. Advantageously, therefore, in the further development 8, the dimensioning of the coupling capacitance 46, 57 and 66 of the circuits corresponding to FIGS. 2, 5 and 7 is avoided. Instead, the pulse generator which, for example, is integrated on the semiconductor chip and which supplies the pulse trains $\phi_{L1}$ and $\phi_{L2}$ for all the regenerator circuits is dimensioned in accordance with equation (8).

Figure 10:
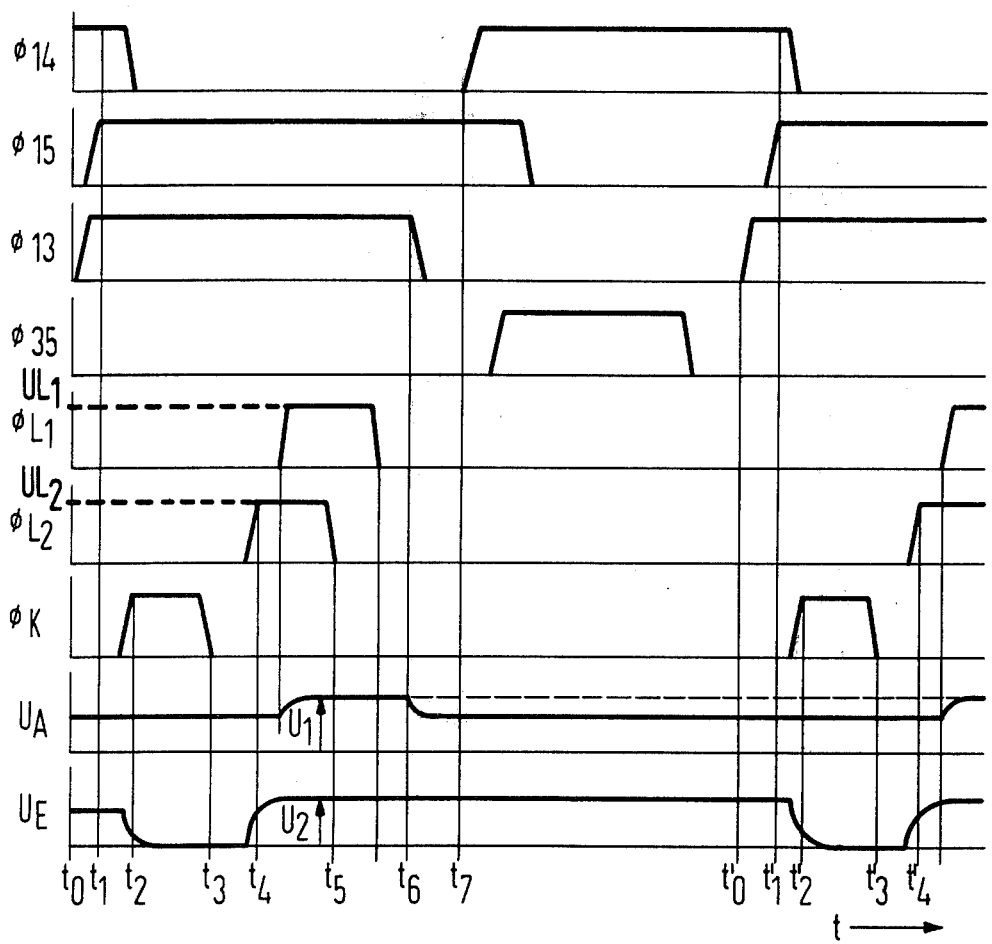
FIG. 10 shows the pulse train program relating to the circuit in FIG. 9.

FIG. 10 illustrates the pulse train program relating to the circuit 8 corresponding to FIG. 9. The function, in detail, is that in the interval of time between $t1$ and $t6$ the reference state is set up by the switching on and off of the pulse trains $\phi_K$, $\phi_{L1}$ and $\phi_{L2}$. The ground line 851 can, similarly to the circuit corresponding to FIG. 3, be spared if the gate 852 of the transistor 85 is connected to the pulse train line 821 or 831.

Similarly, to the circuit shown in FIG. 5, the possibility exists of sparing the transistor 84. This leads to the circuit variant 9 corresponding to FIG. 11. Details of this Figure which have already been explained in association with the other Figures bear the corresponding references.

The transistor 92 is connected on the one hand to the diffusion zone 11 and on the other hand to the drive line 922 (potential $\phi_{L2}$). Its gate terminal 923 is connected to the line 921 (potential $\phi_{L3}$). The transistor 93 is connected on the one hand together with its gate terminal 931 to the line 932 (potential $\phi_{L1}$) and on the other hand to the diffusion zone 32. The transistor 95 is connected on the one side to the line 951 which preferably carries ground potential and on the other side to the diffusion zone 32. The gate terminal 952 of the transistor 952 is connected to the line 953 (potential $\phi_K$). The diffusion zone 11 is connected via the line 91 to the electrode 31.

On operation, to ensure the satisfactory functioning of the circuit, the fundamental equation $U_{L3} = U_{L1} + U_{T1}$ must be taken into consideration. Here $U_{L1}$ is the amplitude of the pulse train $\phi_{L1}$ connected to the line 921 and $U_{L3}$ is the amplitude of the pulse train $\phi_{L3}$ across the line 922.

In the described exemplary embodiments, in the field effect transistors connected as load elements, the gate electrode is in each case connected to the drain electrode. The field effect transistors are transistors of the enhancement type. An advantage of such a circuit consists in the omission of a line for drive purposes.

The gate electrodes of the field effect transistors which serve as load elements can also be pulsed. Such a method of operation offers the advantage of a lower power loss and a lower drive energy.

Finally, the load elements can also be field effect transistors of the depletion type. In this case, the gate electrode is connected to the source electrode. Such a circuit provides the advantage of shorter switching times.

Figure 11:
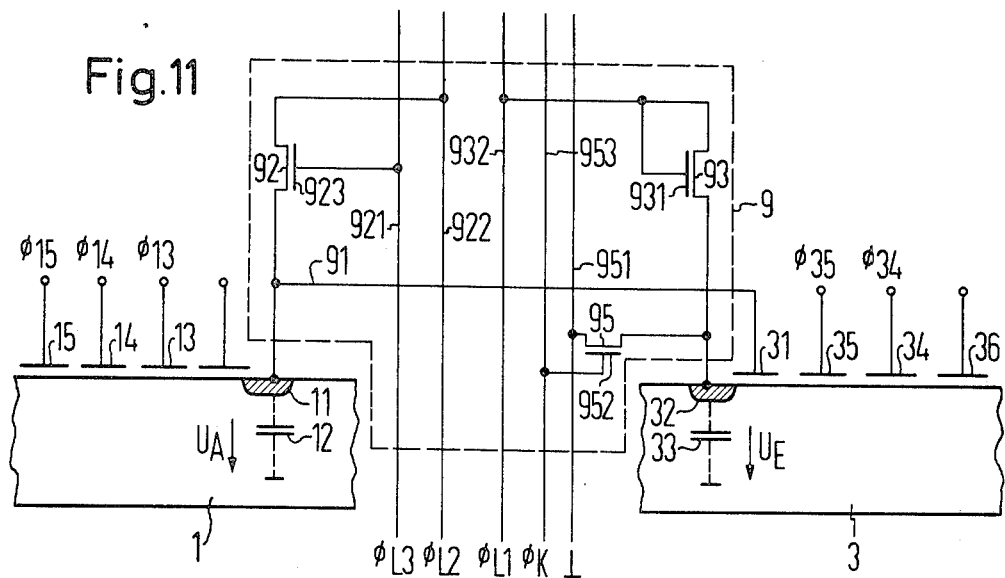
FIG. 11 also shows another further development of the regenerator circuit in accordance with the invention.
Figure 12:
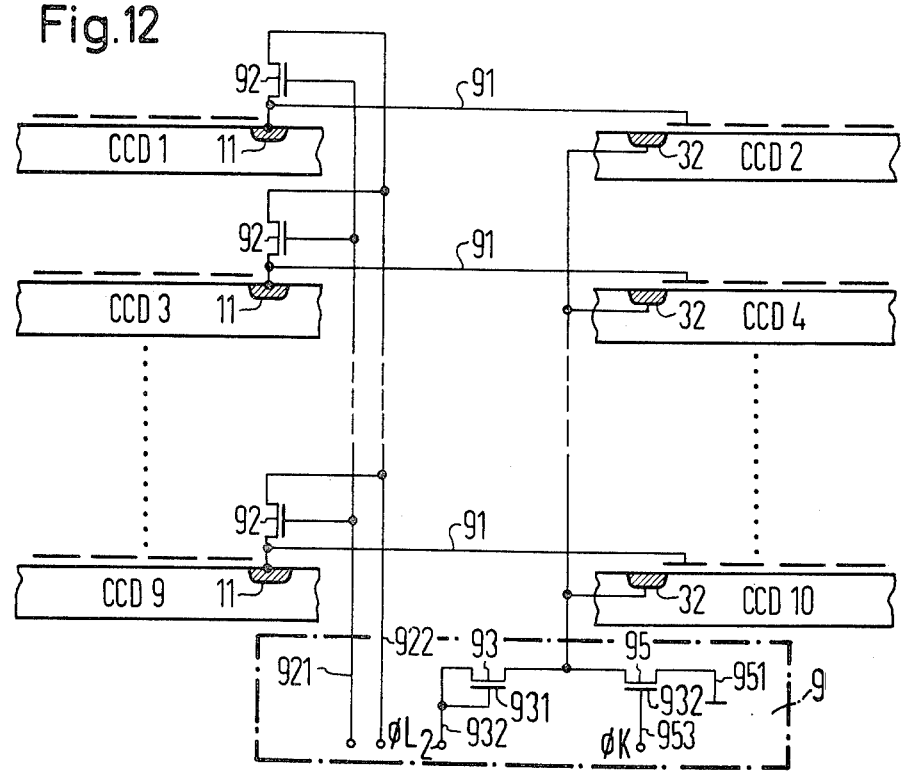

Advantageously, for the purpose of space saving, it is possible to in each case provide the transistors 93 and 95 just once for a number, for example, $N = 5, 10, 20$, etc., CCD circuits, as schematically illustrated in FIG. 12. This is conditional upon the parameter fluctuations on the chip so permitting. In FIG. 12, this is illustrated for the circuit in accordance with the invention corresponding to FIG. 11. Details of FIG. 12 which have already been described in association with the other Figures bear the corresponding references. The CCD arrangements CCD 1, CCD 3, ... to CCD 9, designated with odd-numbered numerals are arranged on the output side. The CCD circuits CCD 2, CCD 4, ... CCD 10 designated with even numerals are arranged on the input side. The diffusion zones 11 of the output-CCD-arrangements with the odd numerals are connected in the manner shown in the Figure via a transistor 92 to the lines 921 and 922. To save space, the transistors 93 and 95 are provided only once and connected via a line 954 to the diffusion zones 32 of the input-CCD arrangements bearing the even numbers.

The centralization which has been represented for the circuit 9 in FIG. 11 is also both possible and effective for the other regenerator circuits in accordance with the invention.

FIGS. 13 to 17 represent the centralizations of the regenerator circuits 4 to 8 shown in FIGS. 2, 5, 7, 8 and 9. In these Figures, for the sake of simplicity, the CCD arrangements have not been shown. Details of FIGS. 13 to 17 which have already been explained in association with one of the FIGS. 2, 5, 7, 8 and 9, have in each case been referenced accordingly.

All the circuit variants of the new regenerator circuit in accordance with the invention can be used both for two-phase, three-phase and four-phase CCD arrangements, the drive means represented in FIG. 3 being retained accordingly.

Preferably, the regenerator circuits in accordance with the invention are constructed, together with the CCD arrangements, in a silicon-gate technique.

It will be apparent to those skilled in the art that many modifications and variations may be effected without departing from the spirit and scope of the novel concepts of the present invention.

We claim as our invention:

1. Regenerator circuit for CCD arrangements for connecting a first CCD arrangement having an output diffusion zone to a second CCD arrangement, said output diffusion zone having a capacitance to ground during operation, said second CCD arrangement having an input diffusion zone, said input diffusion zone having a capacitance to ground during operation, a first input transistor being formed by said input diffusion zone, a gate electrode adjacent said input diffusion zone and a potential well which lies below the next adjacent electrode of said second CCD arrangement, said output diffusion zone being connected via a connection line to said gate electrode of said input transistor, and having a first load element which on the one hand is connected to said output diffusion zone and on the other hand to a first control line to which a first potential with an amplitude having a first value can be connected, a second load element being provided which on the one hand is connected to said first control line and on the other hand to a third load element, said third load element being connected on the one hand to said second load element and on the other hand to said input diffusion zone of said second CCD arrangement, a capacitor coupling said first control line to said input diffusion zone of said second CCD arrangement, a second transistor being connected on the one hand to said input diffusion zone and on the other hand to a second control line to which ground potential can be connected, and the gate terminal of said second transistor being connected to a third control line to which a second potential having a second value can be connected, the capacitance of the coupling capacitor being determined in accordance with the formula:

$$C_{46} = \frac{\sigma_U \cdot C_{33}}{U_R - \sigma_U} = \frac{\frac{\Delta U_A}{2} \cdot C_{33}}{U_R - \frac{\Delta U_A}{2}}$$

where:
$C_{46}$ is the value of said coupling capacitor;
$C_{33}$ is the capacitance between the input diffusion zone and ground;
$U_R$ is the amplitude of the voltage pulses in said first control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and $\delta_U$ is $\Delta U_A$ divided by 2, which arises when a charge is transmitted to the output diffusion zone.

2. The combination according to claim 1 comprising additionally a plurality of first charge coupled device arrangements each having an associated first capacitance, corresponding to an output diffusion zone, and a plurality of second charge coupled device arrangements each having an associated second capacitance, corresponding to an input diffusion zone, arranged such that for each of said first charge coupled device arrangements there exists a corresponding one of said second charge coupled device arrangements; said regenerator circuit having an individual charging means associated with each of said first capacitances and a common charging means for all of said second capacitances causing a selected charge to be regenerated for a selected input/output charge coupled device pair.

3. A regeneragor circuit for a plurality of pairs of input CCDs and output CCDs in which one CCD of each pair is coupled to the other CCD of the same pair in accordance with claim 1, wherein said coupling capacitor, said second transistor and said control lines are common to all of said pairs.

4. A regenerator circuit as set forth in claim 1, which includes a plurality of input stages, a centralized regenerator circuit, the input diffusion zone of said second CCDs being electrically connected to one another, and each being connected by a pulse clock drive line to said centralized regenerator circuit, and in which each of said pulse clock drive lines are connected by load elements to said output diffusion zones of said first CCDs.

5. Regenerator circuit for CCD arrangements for connecting a first CCD arrangement having an output diffusion zone to a second CCD arrangement, said output diffusion zone having a capacitance to ground during operation, said second CCD arrangement having an input diffusion zone, said input diffusion zone having a capacitance to ground during operation, a first input transistor being formed by said input diffusion zone, a gate electrode adjacent said input diffusion zone and a potential well which lies below the next adjacent electrode of said second CCD arrangement, said output diffusion zone being connected via a connection line to said gate electrode of said input transistor, a first load transistor having source, drain and gate electrodes, said source electrode being connected to said output diffusion zone, a first control line to which a first clock pulse potential with an amplitude having a first value being connected to said gate electrode of said first load transistor, a second load transistor having source, drain and gate electrodes, said gate and drain electrodes of said second transistor being connected to said drain electrode of said first load transistor, a second control line to which a clock pulse potential with an amplitude having a second value being connected to the common drain electrode connection of the first and second load transistors, a capacitor coupling said second control line to said input diffusion zone, a third load transistor having source, drain and gate electrodes, said source electrode of said third load transistor being connected to said second control line and said gate electrode of said third load transistor being connected to an additional third control line, the capacitance of the coupling capacitor being determined in accordance with the formula:

$$C_{56} = \frac{\delta_U \cdot C_{33}}{U_{R2} - \delta_U} = \frac{\frac{\Delta U_A}{2} \cdot C_{33}}{U_{R2} - \frac{\Delta U_A}{2}}$$

where:

$C_{56}$ is the capacitance of said coupling capacitor;

$C_{33}$ is the capacitance between the input diffusion zone and ground;

$U_{R2}$ is the amplitude of the voltage pulses in said second control line;

$U_A$ is the value of the charges stored by the capacitance formed between the output diffusion zone and ground;

$\Delta U_A$ is the value of the charge arriving at said output diffusion zone divided by the output capacitance formed between the output diffusion zone and ground; and $\delta_U$ is $\Delta U_A$ divided by 2, which arises when a charge is transmitted to the output diffusion zone.

6. A regenerator circuit for a plurality of pairs of input CCDs and output CCDs in which one CCD of each pair is coupled to the other CCD of the same pair in accordance with claim 5, wherein said second load transistor, said third load transistor, said first, second and third control lines and said coupling capacitor are common to all of said pairs.

7. A regenerator circuit as set forth in claim 5, which includes a plurality of input stages, a centralized regenerator circuit, the input diffusion zone of said second CCDs being electrically connected to one another, and each being connected by a pulse clock drive line to said centralized regenerator circuit, and in which each of said pulse clock drive lines are connected by load transistors to said output diffusion zones of said first CCDs.

8. Regenerator circuit for CCD arrangements for connecting a first CCD arrangement having an output diffusion zone to a second CCD arrangement, said output diffusion zone having a capacitance to ground during operation, said second CCD arrangement having an input diffusion zone, said input diffusion zone having a capacitance to ground during operation, a first input transistor being formed by said input diffusion zone, a gate electrode adjacent said input diffusion zone and a potential well which lies below the next adjacent electrode of said second CCD arrangement, said output diffusion zone being connected via a connection line to said gate electrode of said input transistor, a first load element which on the one hand is connected to said output diffusion zone and on the other hand to a first control line to which a first clock pulse potential can be connected, a second load element being provided which on the one hand is connected to said first control line and on the other hand to a third load element, said third load element being connected on the one hand to said second load element and on the other hand to said input diffusion zone of said second CCD arrangement, a capacitor coupling said first control line to said input diffusion zone of said second CCD arrangement, a second control line to which a clock pulse potential can be connected, a second transistor connected on the one hand to said input diffusion zone of said second CCD arrangement and on the other hand to said first control line, said gate terminal of said second transistor being connected to said second control line, the capacitance of the coupling capacitor being determined in accordance with the formula:

$$C_{66} = \frac{\delta_U \cdot C_{33}}{U_R - \delta_U} = \frac{\frac{\Delta U_A}{2} \cdot C_{33}}{U_R - \frac{\Delta U_A}{2}}$$

where:

$C_{66}$ is the capacitance of said coupling capacitor;
$C_{33}$ is the capacitance between the input diffusion zone and ground;
$U_R$ is the amplitude of the voltage pulses in said first control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and
$\delta_U$ is $\Delta U_A$ divided by 2, which arises when a charge is transmitted to the output diffusion zone.

9. A regenerator circuit for a plurality of pairs of input CCDs and output CCDs in which one CCD of each pair is coupled to the other CCD of the same pair in accordance with claim 8, wherein said coupling capacitor, said first and second control lines said second and third load elements and said second transistor are common to all of said pairs.

10. A regenerator circuit as set forth in claim 8, which includes a plurality of input stages, a centralized regenerator circuit, the input diffusion zone of said second CCDs being electrically connected to one another, and each being connected by a pulse clock drive line to said centralized regenerator circuit, and in which each of said pulse clock drive lines are connected by load elements to said output diffusion zones of said first CCDs.

11. Regenerator circuit for CCD arrangements for connecting a first CCD arrangement having an output diffusion zone to a second CCD arrangement, said output diffusion zone having a capacitance to ground during operation, said second CCD arrangement having an input diffusion zone, said input diffusion zone having a capacitance to ground during operation, a first input transistor being formed by said input diffusion zone, a gate electrode adjacent said input diffusion zone and a potential well which lies below the next adjacent electrode of said second CCD arrangement, said output diffusion zone being connected via a connection line to said gate electrode of said input transistor, a first load element which on the one hand is connected to said output diffusion zone and on the other hand to a first control line to which a first clock pulse potential can be connected, a second load element being provided which on the one hand is connected to said first control line and on the other hand to a third load element, said third load element being connected on the one hand to said second load element and on the other hand to said input diffusion zone of said second CCD arrangement, a capacitor coupling a second control line to which a second clock pulse potential can be coupled to said input diffusion zone of said second CCD arrangement, a second transistor having source, drain and gate electrodes connected on the one hand to said input diffusion zone and on the other hand to ground, a third control line to which a clock pulse potential can be connected, said third control line being connected to said gate electrode of said second transistor, the capacitance of the coupling capacitor being determined in accordance with the formula:

$$C_{75} = \frac{\delta_U \cdot C_{33}}{U_C - \delta_U} = \frac{\frac{\Delta U_A}{2} \cdot C_{33}}{U_C - \frac{\Delta U_A}{2}}$$

where:

$C_{75}$ is the capacitance of said coupling capacitor;
$C_{33}$ is the capacitance between the input diffusion zone and ground;
$U_C$ is the amplitude of the voltage pulses in said second control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and
$\delta_U$ is $\Delta U_A$ divided by 2, which arises when a charge is transmitted to the output diffusion zone.

12. A regenerator circuit for a plurality of pairs of input CCDs and output CCDs in which one CCD of each pair is coupled to the other CCD of the same pair in accordance with claim 11, wherein said second and third load elements, said second transistor, said coupling capacitor and said first, second and third control lines are common to all of said pairs.

13. A regenerator circuit as set forth in claim 11, which includes a plurality of input stages, a centralized regenerator circuit, the input diffusion zone of said second CCDs being electrically connected to one another, and each being connected by a pulse clock drive line to said centralized regenerator circuit, and in which each of said pulse clock drive lines are connected by load elements to said output diffusion zones of said first CCDs.

14. Regenerator circuit for CCD arrangements for connecting a first CCD arrangement having an output diffusion zone to a second CCD arrangement, said output diffusion zone having a capacitance to ground during operation, said second CCD arrangement having an input diffusion zone, said input diffusion zone having a capacitance to ground during operation, a first input transistor being formed by said input diffusion zone, a gate electrode adjacent said input diffusion zone and a potential well which lies below the next adjacent electrode of said second CCD arrangement, said output diffusion zone being connected via a connection line to said gate electrode of said input transistor, first, second and third clock pulse potential control lines, a fourth control line to which ground potential can be connected, a first load element which on the one hand is connected to said output diffusion zone and on the other hand to said first control line, a second load element being provided which on the one hand is connected to said second control line and on the other hand to a third load element, said third load element being connected on the one hand to said second load element and on the other hand to said input diffusion zone of said second CCD arrangement, a second transistor connected between said fourth control line and said input diffusion zone, and the gate terminal of said second transistor being connected to said third control line.

15. A regenerator circuit for a plurality of pairs of inputs CCDs and output CCDs in which one CCD of each pair is coupled to the other CCD of the same pair in accordance with claim 14, wherein said first, second, third and fourth control lines, said second and third load elements and said second transistor are common to all of said pairs.

16. Regenerator circuit for CCD arrangements for connecting a first CCD arrangement having an output diffusion zone to a second CCD arrangement, said output diffusion zone having a capacitance to ground during operation, said second CCD arrangement having an input diffusion zone, said input diffusion zone having a capacitance to ground during operation, a first input transistor being formed by said input diffusion zone, a gate electrode adjacent said input diffusion zone and a potential well which lies below the next adjacent electrode of said second CCD arrangement, said output diffusion zone being connected via a connection line to said gate electrode of said input transistor, first, second, third and fourth control lines to which clock pulse potentials can be connected, and a fifth control line to which a ground potential can be connected, a second transistor having its channel connected between said output diffusion zone and said first control line and having its gate electrode connected to said second control line, a third transistor having its channel connected between said third control line and said input diffusion zone of said second CCD arrangement, the gate of said third transistor being connected to said third control line, a fourth transistor having its channel connected between said fifth control line and said input diffusion zone of said second CCD arrangement and its gate electrode connected to said fourth control line.

17. A regenerator circuit for a plurality of pairs of input CCDs and output CCDs in which one CCD of each pair is coupled to the other CCD of the same pair in accordance with claim 16, wherein said first, second, third, fourth and fifth control lines, said third and fourth transistors are common to all of said pairs.

18. The combination of two CCD arrangements and a regenerator circuit comprising a first and second CCD arrangement; a first capacitance and means to charge said first capacitance to a predetermined potential; a second capacitance and means to charge said second capacitance to a predetermined potential; means to detect the absence of charge at the output terminal of said first CCD arrangement and not discharging said first capacitance, gate means at the input to said second CCD arrangement detecting the presence of charge on said first capacitance and the injection of charge from said second capacitance into the input terminal of said second CCD arrangement being permitted; means to detect the presence of charge at said output terminal of said first CCD arrangement and discharge said first capacitance, said gate means detecting the absence of charge on said first capacitance and and the injection of charge from said second capacitance into said second CCD arrangement being blocked, said first and second CCD arrangements comprising charge coupled devices having an input terminal and an output terminal; said first and second capacitances comprising capacitances in the output diffusion zone associated with said output terminal of said first charge coupled device and in the input diffusion zone associated with said input terminal of said second charge coupled device, said means to charge said first capacitance comprising a first transistor connected between said first capacitance and a first control potential terminal, said transistor having its gate input connected to said first control potential terminal; wherein said means to charge said second capacitance comprises a circuit mode, a second transistor connected between said first control potential terminal and said circuit node, said second transistor having its gate input connected to said first control potential terminal and a third transistor connected between said circuit node and said second capacitance, said third transistor having its gate input connected to said circuit node; comprising additionally a fourth transistor connected between said second capacitance and a reference potential, said fourth transistor having its gate input connected to a second control potential terminal, and a third capacitance connected between said second capacitance and said first control potential terminal; the value of said third capacitance being determined in accordance with:

$$C_{46} = \frac{\sigma_U \cdot C_{33}}{U_R - \sigma_U} = \frac{\frac{\Delta U_A}{2} \cdot C_{33}}{U_R - \frac{\Delta U_A}{2}}$$

where:
$C_{46}$ is the value of said third capacitance;
$C_{33}$ is the capacitance between the input diffusion zone and ground;
$U_R$ is an amplitude of the voltage pulses in said first control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and
$\delta_U$ is $\Delta U_A$ divided by 2, which arises when a charge is transmitted to the output diffusion zone.

19. The combination of two CCD arrangements and a regenerator circuit comprising a first and second CCD arrangement; a first capacitance and means to charge said first capacitance to a predetermined potential; a second capacitance and means to charge said second capacitance to a predetermined potential; means to detect the absence of charge at the output terminal of said first CCD arrangement and not discharging said first capacitance, gate means at the input to said second CCD arrangement detecting the presence of charge on said first capacitance and the injection of charge from said second capacitance into the input terminal of said second CCD arrangement being permitted; means to detect the presence of charge at said output terminal of said first CCD arrangement and discharge said first capacitance, said gate means detecting the absence of charge on said first capacitance and the injection of charge from said second capacitance into said second CCD arrangement being blocked, said first and second CCD arrangements comprising charge coupled devices having an input terminal and an output terminal; said first and second capacitances comprising capacitances in the output diffusion zone associated with said output terminal of said first charge coupled device and in the input diffusion zone associated with said input terminal of said second charge coupled device, said means to charge said first capacitance comprising a first transistor connected between said first capacitance and a first control potential terminal; wherein said means to charge said second capacitance comprises a second transistor connected between said first control potential terminal and said input terminal to said second charge coupled device; comprising additionally a third transfer connected between said second capacitance and said first control potential terminal, said third transistor having its gate input connected to a second control potential terminal and a third capacitance connected between said second capacitance and said first control potential terminal; the value of said third capacitance being determined in accordance with:

$$C_{56} = \frac{\delta_U \cdot C_{33}}{U_{R2} - \delta_U} = \frac{\frac{\Delta U_A}{2} \cdot C_{33}}{U_{R2} - \frac{\Delta U_A}{2}}$$

where:
$C_{56}$ is the capacitance of said third capacitance;
$C_{33}$ is the capacitance between the input diffusion zone and ground;
$U_{R2}$ is the amplitude of the voltage pulses in said first control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and
$\delta_U$ is $\Delta U_A$ divided by 2, which arises when a charge is transmitted to the output diffusion zone.

20. The combination of two CCD arrangements and a regenerator circuit comprising a first and second CCD arrangement; a first capacitance and means to charge said first capacitance to a predetermined potential; a second capacitance and means to charge said second capacitance to a predetermined potential; means to detect the absence of charge at the output terminal of said first CCD arrangement and not discharging said first capacitance, gate means at the input to said second CCD arrangement detecting the presence of charge on said first capacitance and the injection of charge from said second capacitance into the input terminal of said second CCD arrangement being permitted; means to detect the presence of charge at said output terminal of said first CCD arrangement and discharge said first capacitance, said gate means detecting the absence of charge on said first capacitance and the injection of charge from said second capacitance into said second CCD arrangement being blocked, said first and second CCD arrangements comprising charge coupled devices having an input terminal and an output terminal; said first and second capacitances comprising capacitances in the output diffusion zone associated with said output terminal of said first charge coupled device and in the input diffusion zone associated with said input terminal of said second charge coupled device, said means to charge said first capacitance comprising a first transistor connected between said first capacitance and a first control potential terminal, said first transistor having its gate input connected to said first control potential terminal; wherein said means to charge said second capacitance comprises a circuit node, a second transistor connected between said first control potential terminal and said circuit node, said second transistor having its gate input connected to said first control potential terminal and a third transistor connected between said circuit node and said second capacitance, said third transistor having its gate input connected to said circuit node; and comprising additionally a fourth transistor connected between said second capacitance and said first control potential terminal, said fourth transistor having its gate input connected to a second control potential terminal and a third capacitance connected between said first control potential terminal and said second capacitance; the value of said third capacitance being determined in accordance with:

$$C_{66} = \frac{\delta_U \cdot C_{33}}{U_R - \delta_U} = \frac{\frac{\Delta U_A}{2} \cdot C_{33}}{U_R - \frac{\Delta U_A}{2}}$$

where:
$C_{66}$ is the capacitance of said third capacitance;
$C_{33}$ is the capacitance between the input diffusion zone and ground;
$U_R$ is the amplitude of the voltage pulses in said first control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and
$\delta_U$ is $\Delta U_A$ divided by 2, which arises when a charge is transmitted to the output diffusion zone.

21. The combination of two CCD arrangements and a regenerator circuit comprising a first and second CCD arrangement; A first capacitance and means to charge said first capacitance to a predetermined potential; a second capacitance and means to charge said second capacitance to a predetermined potential; means to direct the absence of charge at the output terminal of said first CCD arrangement and not discharging said first capacitance, gate means at the input to said second CCD arrangement detecting the presence of charge on said first capacitance and the injection of charge from said second capacitance into the input terminal of said second CCD arrangement being permitted; means to detect the presence of charge at said output terminal of said first CCD arrangement and discharge said first capacitance, said gate means detecting the absence of charge on said first capacitance and the injection of charge from said second capacitance into said second CCD arrangement being blocked, said first and second CCD arrangements comprising charge coupled devices having an input terminal and an output terminal; said first and second capacitances comprising capacitances in the output diffusion zone associated with said output terminal of said first charge coupled device and in the input diffusion zone associated with said input terminal of said second charge coupled device, said means to charge said first capacitance comprising a first transistor connected between said first capacitance and a first control potential terminal, said first transistor having its gate input connected to said first control potential terminal; wherein said means to charge said second capacitance comprises a circuit node, a second transistor connected between said first control potential terminal and said circuit node, said second transistor having its gate input connected to said first control potential terminal and a third transistor connected between said circuit node and said second capacitance, said third transistor having its gate input connected to said circuit node; comprising additionally a fourth transistor connected between said second capacitance and a reference potential terminal, said fourth transistor having its gate input connected to a second control potential terminal and a third capacitance connected between said second capacitance and a third control potential terminal; the value of said third capacitance being determined in accordance with:

$$C_{75} = \frac{\delta_U \cdot C_{33}}{U_C - \delta_U} = \frac{\frac{\Delta U_A}{2} \cdot C_{33}}{U_C - \frac{\Delta U_A}{2}}$$

where:
$C_{75}$ is the capacitance of said third capacitance;
$C_{33}$ is the capacitance between the input diffusion zone and ground;
$U_C$ is the amplitude of the voltage pulses in said third control line;
$U_A$ is the value of the charges stored by the capacitance formed between the output diffusion zone and ground;
$\Delta U_A$ is the value of the charge arriving at said output diffusion zone divided by the output capacitance formed between the output diffusion zone and ground; and
$\delta_U$ is $\Delta U_A$ divided by 2, which arises when a charge is transmitted to the output diffusion zone.

22. The combination of two CCD arrangements and a regenerator circuit comprising a first and second CCD arrangement; a first capacitance and means to charge said first capacitance to a predetermined potential; a second capacitance and means to charge said second capacitance to a predetermined potential; means to detect the absence of charge at the output terminal of said first CCD arrangement and not discharging said first capacitance, gate means at the input to said second CCD arrangement detecting the presence of charge on said first capacitance and the injection of charge from said second capacitance into the input terminal of said second CCD arrangement being permitted; means to detect the presence of charge at said output terminal of said first CCD arrangement and discharge said first capacitance, said gate means detecting the absence of charge on said first capacitance and the injection of charge from said second capacitance into said second CCD arrangement being blocked, said first and second CCD arrangements comprising charge coupled devices having an input terminal and an output terminal; said first and second capacitances comprising capacitances in the output diffusion zone associated with said output terminal of said first charge coupled device and in the input diffusion zone associated with said input terminal of said second charge coupled device, said means to charge said first capacitance comprising a first transistor connected between said first capacitance and a first control potential terminal, said first transistor having its gate connected to said first control potential terminal; wherein said means to charge said second capacitance comprises a circuit node, a second transistor connected between a second control potential terminal and said circuit node, said second transistor having its gate input connected to said second control potential terminal and a third transistor connected between said circuit node and said second capacitance, said third transistor having its gate connected to said circuit node; comprising additionally a fourth transistor connected between said second capacitance and a reference potantial terminal said fourth transistor having its gate input connected to a third control potential terminal.

23. The combination of two CCD arrangement and a regenerator circuit comprising a first and second CCD arrangement; a first capacitance and means to charge said first capacitance to a predetermined potential; a second capacitance and means to charge said second capacitance to a predetermined potential; means to detect the absence of charge at the output terminal of said first CCD arrangement and not discharging said first capacitance, gate means at the input to said second CCD arrangement detecting the presence of charge on said first capacitance and the injection of charge from said second capacitance into the input terminal of said second CCD arrangement being permitted; means to detect the presence of charge at said output terminal of said first CCD arrangement and discharge said first capacitance, said gate means detecting the absence of charge on said first capacitance and the injection of charge from said second capacitance into said second CCD arrangement being blocked, said first and second CCD arrangements comprising charge coupled devices having an input terminal and an output temrinal; said first and second capacitances comprising capacitances in the output diffusion zone associated with said output terminal of said first charge coupled device and in the input diffusion zone associated with said input terminal of said second charge coupled device, said means to charge said first capacitance comprising a first transistor connected between said first capacitance and a first control potential terminal, said first transistor having its gate input connected to a second control potential terminal; wherein said means to charge said second capacitance comprises a second transistor connected between a third control potential terminal and said second capacitance, said second transistor having its gate input connected to said third control potential terminal; comprising additionally a third transistor connected between said second capacitance and a reference potential terminal, said third transistor having its gate input connected to a fourth control potential terminal.

* * * * *